(12) United States Patent
Yoon et al.

(10) Patent No.: US 8,612,836 B2
(45) Date of Patent: Dec. 17, 2013

(54) NON-VOLATILE MEMORY DEVICE WITH UNCORRECTABLE INFORMATION REGION AND OPERATION METHOD USING THE SAME

(75) Inventors: Han Bin Yoon, Hwaseong-si (KR); Mi Kyoung Jang, Seoul (KR); Jin-Hyuk Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 347 days.

(21) Appl. No.: 13/025,463

(22) Filed: Feb. 11, 2011

(65) Prior Publication Data

US 2011/0202818 A1 Aug. 18, 2011

(30) Foreign Application Priority Data

Feb. 12, 2010 (KR) .......................... 10-2010-0013183

(51) Int. Cl.
*H03M 13/00* (2006.01)
(52) U.S. Cl.
USPC ...... 714/785; 714/763; 714/784; 365/185.09; 365/185.33
(58) Field of Classification Search
USPC ......... 714/763, 784, 785; 365/185.09, 185.33
See application file for complete search history.

(56) References Cited

U.S. PATENT DOCUMENTS

| | | | | |
|---|---|---|---|---|
| 6,119,245 | A * | 9/2000 | Hiratsuka | 714/6.11 |
| 7,350,044 | B2 * | 3/2008 | Keays | 711/165 |
| 7,502,970 | B2 * | 3/2009 | Aizawa | 714/42 |
| 7,594,135 | B2 * | 9/2009 | Gonzalez et al. | 714/6.1 |
| 8,050,095 | B2 * | 11/2011 | Gonzalez et al. | 365/185.11 |
| 8,243,570 | B2 * | 8/2012 | White et al. | 369/53.21 |
| 8,245,101 | B2 * | 8/2012 | Olbrich et al. | 714/753 |
| 8,291,295 | B2 * | 10/2012 | Harari et al. | 714/763 |
| 8,312,349 | B2 * | 11/2012 | Reche et al. | 714/773 |
| 8,327,220 | B2 * | 12/2012 | Borchers et al. | 714/758 |
| 2009/0055680 | A1 * | 2/2009 | Honda et al. | 714/5 |
| 2010/0325524 | A1 * | 12/2010 | Yang et al. | 714/773 |

\* cited by examiner

*Primary Examiner* — Esaw Abraham
(74) *Attorney, Agent, or Firm* — Lee & Morse, P.C.

(57) ABSTRACT

The non-volatile memory system includes a non-volatile memory and a controller. The non-volatile memory includes a data region including a sector region for storing sector data, and an uncorrectable information region for storing uncorrectable sector information on the sector region. The controller includes an information generation unit for generating the uncorrectable sector information that indicates whether the sector region is assigned to an uncorrectable sector region, according to a command output from a host.

27 Claims, 4 Drawing Sheets

NON-VOLATILE MEMORY DEVICE WITH UNCORRECTABLE INFORMATION REGION AND OPERATION METHOD USING THE SAME

BACKGROUND

1. Field

Embodiments relate to an uncorrectable sector region management technology, and more particularly, to a non-volatile memory system that stores information about an uncorrectable sector region of a page, in the page, and a method of operating the non-volatile memory system.

2. Description of the Related Art

Large capacity storage devices, such as hard disk drives, use a standard interface specification for data transfer and management with a host computer. A typical example of the standard interface specification may be an advanced technology attachment (ATA) or a small computer system interface (SCSI). A large capacity storage device supports a command that is intentionally given by a host computer to assign an uncorrectable sector region.

SUMMARY

One or more embodiments of one or more features described herein may provide a non-volatile memory system adapted to store uncorrectable sector information on some or all logical addresses using a reserved region of each page.

One or more embodiments of one or more features described herein may provide a non-volatile memory system adapted to store information about an uncorrectable sector region in a page including an uncorrectable sector region and may more efficiently manage uncorrectable sector information.

One or more embodiments of one or more features described herein may provide a method of operating a non-volatile memory system adapted to store information about an uncorrectable sector region in a page including an uncorrectable sector region and may more efficiently manage uncorrectable sector information.

One or more embodiments of one or more features described herein may provide a non-volatile memory system employing in which uncorrectable sector information may be stored in a page where sector data is stored.

One or more embodiments of one or more features described herein may provide a non-volatile memory system in which uncorrectable sector information may be more efficiently managed relative to comparable conventional systems.

One or more embodiments of one or more features described herein may provide a non-volatile memory system, including a non-volatile memory including a data region including a sector region for storing sector data, and an uncorrectable information region for storing uncorrectable sector information on the sector region, and a controller including an information generation unit adapted to generate the uncorrectable sector information that indicates whether the sector region is assigned to an uncorrectable sector region, according to a command output from a host.

The data region and the uncorrectable information region may exist on a same page.

The sector region may include a write data region for storing write data and a management region for storing an error correction code to perform error correction with respect to the write data stored in the write data region, wherein the controller may include an error correction code generation unit for storing the error correction code in the management region to generate an error during the error correction when the information generation unit assigns the sector region to be the uncorrectable sector region.

The controller may further include a microprocessor, a read only memory (ROM), a random access memory (RAM), a host interface, and a non-volatile memory interface.

The error correction code generation unit may be a processing module adapted to execute a program stored in the ROM or the RAM under control of the microprocessor.

The non-volatile memory interface may be adapted to provide an interface for communications between the microprocessor and the non-volatile memory under control of the microprocessor.

The non-volatile memory may include a NAND flash memory and the non-volatile memory interface includes a NAND flash memory interface.

The non-volatile memory may include a plurality of flash memory cells.

A memory cell array may include a plurality of flash memory cells that are divided into n blocks, and each of the n blocks may be divided into m pages, and each of the m pages may include a region corresponding to the data region and a region corresponding to the uncorrectable information region, where n and m are each natural numbers.

The respective data region of each of the m pages may include a plurality of sector regions, each of the sector regions may include a write data region for storing write data and a management region for storing management information.

The management information may include an error correction code for performing error correction with respect to the corresponding write data.

The respective region including the uncorrectable sector information may stores information with respect to each of the sector regions.

The system may be a memory card.

The system may be a solid state drive (SSD).

One or more embodiments of one or more features described herein may provide a data processing system, including a non-volatile memory system, and a host capable of accessing the non-volatile memory system, wherein the non-volatile memory system includes a non-volatile memory including a data region comprising a sector region for storing sector data, and an uncorrectable information region for storing uncorrectable sector information on the sector region, and a controller including an information generation unit adapted to generate the uncorrectable sector information that indicates whether the sector region is assigned to an uncorrectable sector region, according to a command output from a host.

The data region and the uncorrectable information region may exist on a same page.

The sector region may include a write data region for storing write data and a management region for storing an error correction code to perform error correction with respect to the write data stored in the write data region, wherein the controller includes an error correction code generation unit for storing the error correction code in the management region to generate an error during the error correction when the information generation unit assigns the sector region to be the uncorrectable sector region.

The data processing system may be a personal computer (PC) or tablet PC.

One or more embodiments of one or more features described herein may provide a method of operating a non-volatile memory system, the method including receiving, by a controller, a command output from a host, generating, by the controller, uncorrectable sector information indicating whether a sector region of a page of a non-volatile memory is assigned to an uncorrectable sector region according to a received command, and storing, by the controller, generated uncorrectable sector information in an uncorrectable information region of the page.

The method may include adding, by the controller, an error correction code to the write data by using an error correction code generation unit to generate a failure during error correction with respect to the write data when the sector region is assigned to the uncorrectable sector region.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
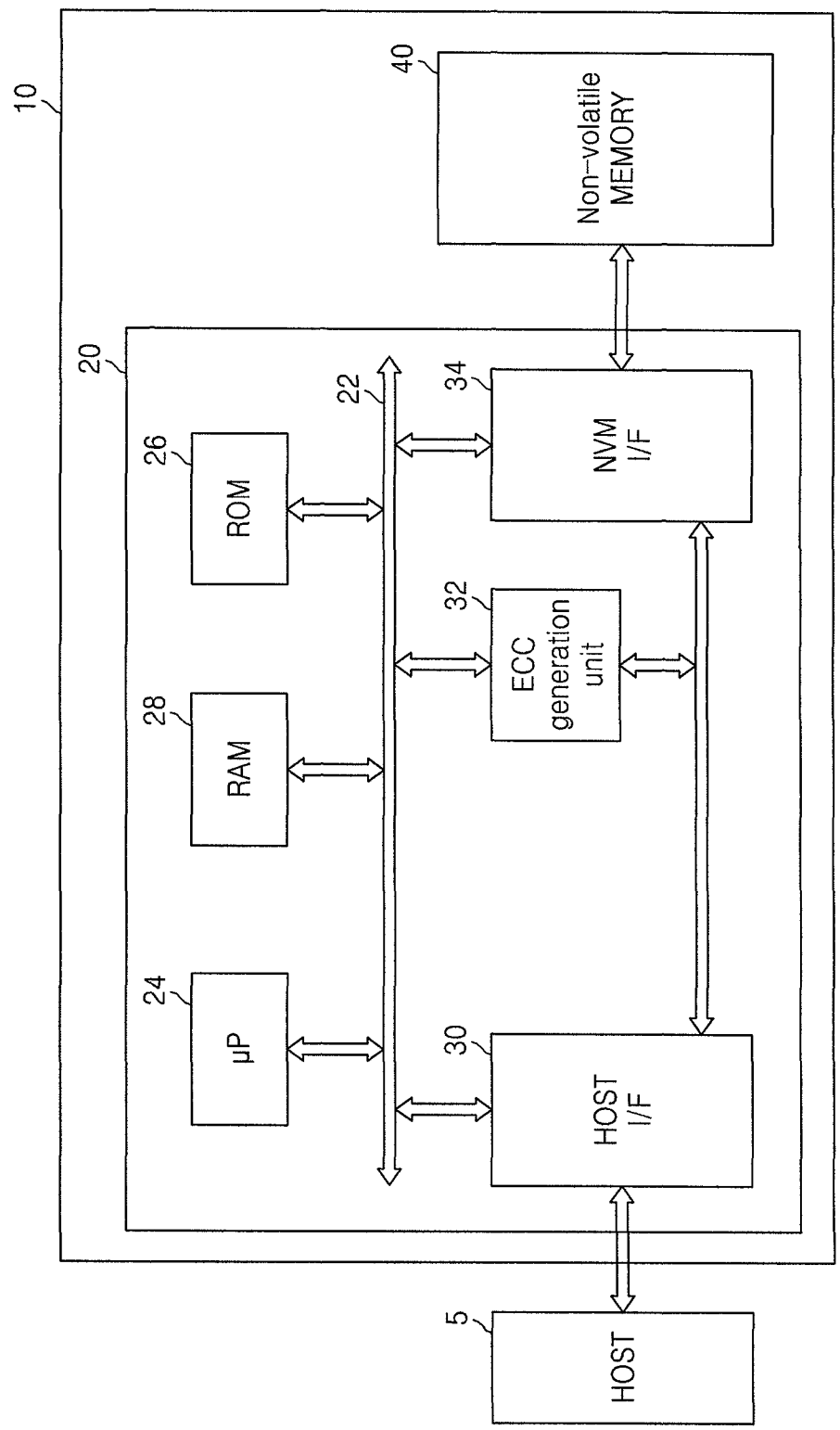
FIG. 1 illustrates a block diagram of an exemplary embodiment of a data processing system.

Korean Patent Application No. 10-2010-0013183, filed on Feb. 12, 2010, in the Korean Intellectual Property Office, and entitled: "Non-Volatile Memory Device and Operation Method Using the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when an element is referred to as being "between" two elements, it may be the only element between the two elements, or one or more intervening elements may also be present. Like reference numerals refer to like elements throughout the specification.

FIG. 1 illustrates a block diagram of an exemplary embodiment of a data processing system 1. Referring to FIG. 1, the data processing system 1 may include an access device, e.g., a host 5, for writing data to a non-volatile memory system 10 or reading data written to the non-volatile memory system 10.

In some embodiments, the host 5 and the non-volatile memory system 10 may exchange data using an advanced technology attachment (ATA) interface or a small computer system interface (SCSI) interface. In embodiments, the non-volatile memory system 10 may generate uncorrectable sector information indicating whether each of the overall sector regions corresponding to the overall logical addresses is an uncorrectable sector region. If the overall logical address is an uncorrectable sector region, the non-volatile memory system 10 may store a type of the uncorrectable sector region. The non-volatile memory system 10 may store generated uncorrectable sector information in a page of a non-volatile memory 40.

The data processing system 1 may be a personal computer (PC), a portable computer, a mobile phone, a smart phone, a personal digital assistant (PDA), a portable multimedia player (PMP), a GPS automotive navigation system, an MP3 player, an audio equipment, a television (TV), a digital camera, a camcorder, etc.

The non-volatile memory system 10 may be embodied by a smart card, a memory card, or a memory device, for example, a solid state drive (SSD), a memory stick, a USB memory stick, etc.

The memory system 10 may include a memory controller 20 and the non-volatile memory 40. The memory controller 20 and the non-volatile memory 40 may each be embodied by a single chip or separate chips. In FIG. 1, for convenience, a single non-volatile memory is illustrated as the non-volatile memory 40. However, embodiments are not limited thereto, e.g., the memory controller 20 may control the operations of a plurality of non-volatile memory chips.

The host 5 may exchange data with the non-volatile memory 40 via the memory controller 20. The memory controller 20 may include a microprocessor 24, a read only memory (ROM) 26, a random access memory (RAM) 28, a host interface 30, an error correction code generation unit 32, and a non-volatile memory interface 34. In embodiments, a buffer (not shown) may be provided between the host interface 30 and the non-volatile memory interface 34. The buffer may be embodied by a page buffer that may temporarily store data exchanged between the host 5 and the non-volatile memory 40.

The microprocessor 24, the ROM 26, the RAM 28, the host interface 30, the error correction code generation unit 32, and the non-volatile memory interface 34 may be connected to one another via a bus 22 and may exchange data therebetween.

The microprocessor 24 may execute a program stored in the ROM 26. The ROM 26 may store a program that is executed by the microprocessor 24. For example, the ROM 26 may store a program for controlling or managing the host interface 30, the error correction code generation unit 32, and the non-volatile memory interface 34.

The RAM 28 may temporarily store a program executed by the microprocessor 24. The host interface 30 may provide an interface for communications between the host 5 and the microprocessor 24 under the control of the microprocessor 24. For example, the interface may be an ATA interface, a serial ATA interface, a parallel ATA interface, or a SCSI interface.

The error correction code generation unit 32, which may be referred to as an error correction code engine, may generate an error correction code from write data output from the host 5. The error correction code generation unit 32 may add the error correction code to the write data. The error correction code generation unit 32 may write the write data and the error correction code to a sector region of a page of the non-volatile memory 40 as sector data. The error correction code generation unit 32 may corrupt an error correction code to be written to the uncorrectable sector region so as to generate a failure in the uncorrectable sector region during error correction. The error correction code generation unit 32 may be embodied by a processing module adapted to execute a program stored in the ROM 26 or the RAM 28 under the control of the microprocessor 24.

The non-volatile memory interface 34 may provide an interface for communications between the microprocessor 24 and the non-volatile memory 40 under the control of the microprocessor 24. When the non-volatile memory 40 is embodied by a NAND flash memory, the interface may be embodied by a NAND flash memory interface. The interface may correspond to hardware for data communications or hardware with embedded firmware for data communications.

The non-volatile memory 40 may include a plurality of flash memory cells and an access circuit (not shown) capable of accessing at least one of the flash memory cells. In embodiments, each of the memory cells may include an electrically erasable programmable read-only memory (EEPROM), a flash memory, a magnetic RAM (MRAM), a spin-transfer torque MRAM (MRAM), a conductive bridging RAM (CBRAM), a ferroelectric RAM (FeRAM), a phase change RAM (PRAM), a resistive RAM (RRAM or ReRAM), a nanotube RRAM, a polymer RAM (PoRAM), a nano floating gate memory (NFGM), a holographic memory, a molecular electronics memory device, an insulator resistance change memory, etc. Each of the non-volatile memory cells may store a bit or a plurality of bits.

Figure 2:
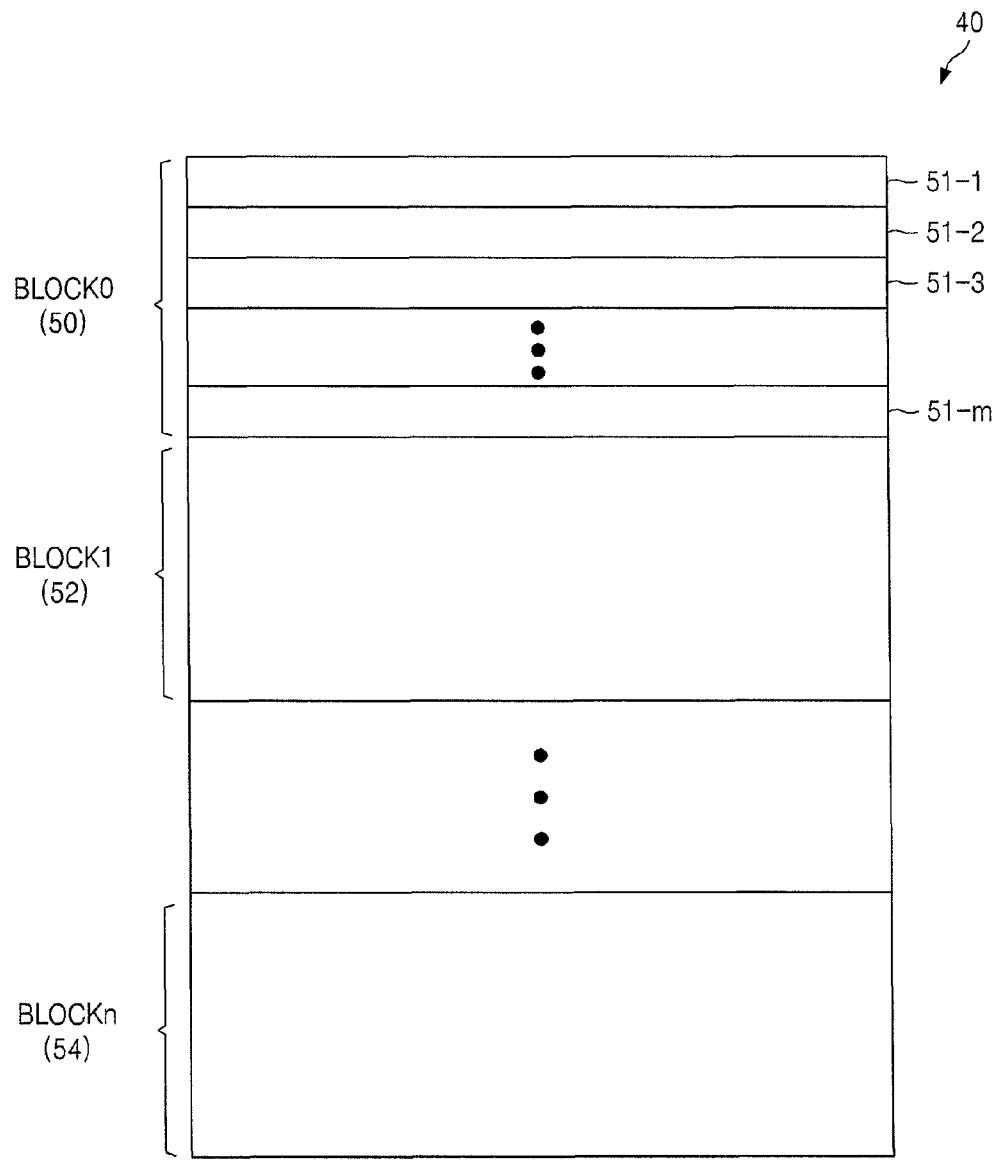
FIG. 2 illustrates a schematic diagram of an exemplary embodiment of an address space of the data processing system of FIG. 1.
Figure 3:
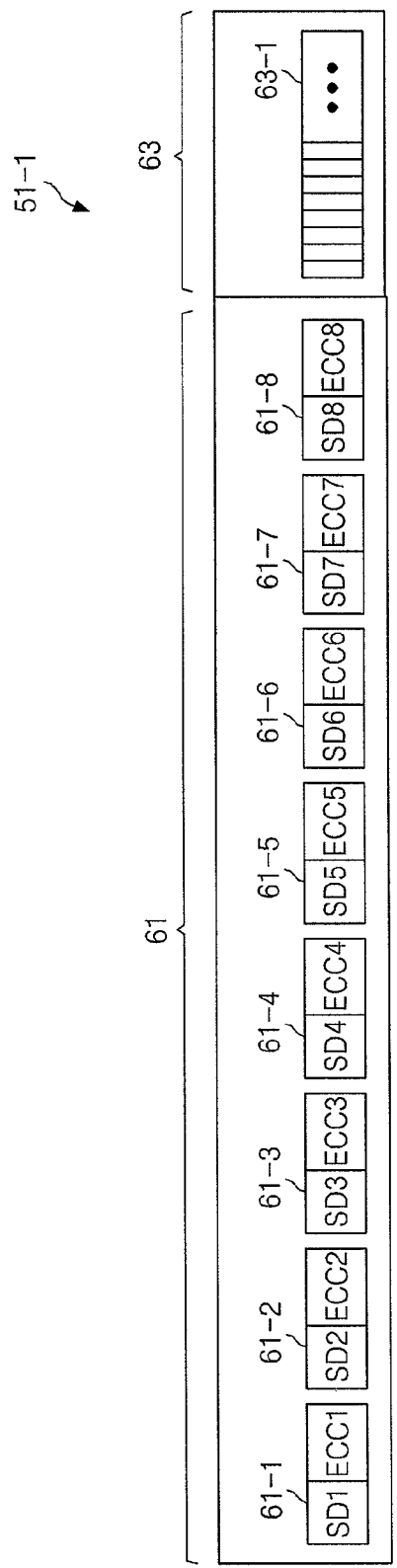
FIG. 3 illustrates a schematic diagram of an exemplary embodiment of an exemplary page of FIG. 2.

FIG. 2 illustrates a schematic diagram of an exemplary embodiment of an address space of the data processing system 1 of FIG. 1. FIG. 3 illustrates a schematic diagram of an exemplary page 51 of FIG. 2.

Referring to FIGS. 1-3, the microprocessor 24 may receive the write data with logical addresses where the write data is to be programmed. The microprocessor 24 may map the received logical addresses to physical addresses of a plurality of pages embodied in the non-volatile memory 40.

As illustrated in FIG. 2, a memory cell array of the non-volatile memory 40 may be divided into n-number of blocks 50, 52, . . . , 54, where "n" is a natural number. Each of the n-number of blocks 50, 52, . . . , 54 may correspond to a smallest unit of the memory cells that may be erased together by one time erase operation. Each of the n-number of blocks 50, 52, . . . , 54 may be divided into m-number of pages 51-1 through 51-*m*, where "m" is a natural number.

Referring to FIG. 3, each of the m-number of pages 51-1 through 51-*m* may include a data region 61 and a reserved region 63. The data region 61 may include a plurality of sector regions 61-1 through 61-8. The reserved region 63, which may be referred to as a substitute region or a redundancy, may include uncorrectable information region 63-1 for storing uncorrectable information with respect to each of a plurality of sector regions 61-1 through 61-8. More particularly, e.g., the page 51-1 that is one of the pages 51-1 through 51-*m* may be embodied by 4224 bytes. When eight 512-byte write data are stored in the page 51-1, each of the eight write data may be respectively stored in each of the sector regions 61-1 through 61-8.

Each of the sector regions 61-1 through 61-8 may include a write data region and a management region. Each of a plurality of write data SD1 through SD8 may be stored in each write data region. Each management information, e.g., each of a plurality of error correction codes ECC1-ECC8 for performing error correction with respect to each of the write data SD1-SD8 may be stored in each management region. Each of the error correction codes ECC1-ECC8 may be generated by the error correction code generation unit 32. One write data and one management information may constitute one sector data.

More particularly, e.g., when each of the error correction codes ECC1-ECC8 is 12 bytes, since each sector data is 524 bytes, even if eight sector data, that is, a total of 4192 bytes, are written to the page 51-1, a 32-byte space is left. In such embodiments, the non-volatile memory system 10 may use the 32-byte space, that is, the reserved region 63, as the uncorrectable information region 63-1.

Thus, the memory controller 20, e.g., an information generation unit (not shown), may generate uncorrectable information, which may indicate whether each of the particular sector regions 61-1 through 61-8 is assigned as an uncorrectable sector region, according to a specific command output from the host 5. For example, a command may be employed to intentionally assign a particular sector region of all sector regions forming the memory cell array of the non-volatile memory 40 to be the uncorrectable sector regions, and to write generated uncorrectable information to the uncorrectable information region 63-1.

For example, the memory controller 20 may set or assign at least one sector region embodied in the non-volatile memory 40 to be an uncorrectable sector region according to a particular command output from the host 5.

The information generation unit may be embodied in the microprocessor 24 or in form of a separate module outside the microprocessor 24. The information generation unit may be embodied by, e.g., a module such as software or hardware, which may generate uncorrectable information.

For example, when the host 5 desires to assign the first sector region 61-1 and the last sector region 61-8 of the sector regions 61-1 through 61-8 of FIG. 3 to be uncorrectable sector regions, the memory controller 20 may generate uncorrectable information with respect to the first sector region 61-1 and the last sector region 61-8. The memory controller 20 may write generated uncorrectable information to the uncorrectable information region 63-1 through the non-volatile memory interface 34, according to a command output from the host 5, for example, a command including the logical addresses indicating the first sector region 61-1 and the last sector region 61-8.

The uncorrectable information may be stored in the uncorrectable information region 63-1 in the same page including the first sector region 61-1 and the last sector region 61-8. That is, the uncorrectable information with respect to the uncorrectable sector region of the sector region included in each page may be stored together in each page.

In some exemplary embodiments, the uncorrectable information may be stored in form of a bit map and be formed of a plurality of bits. For example, when the uncorrectable information is formed of 2 bits, the memory controller 20 may assign 2 bits for each uncorrectable sector region. Table 1 shows an example of uncorrectable information embodied by 2 bits.

TABLE 1

| Uncorrectable Information | Definition | Host Report | Block Map Out | Error Logging |
|---|---|---|---|---|
| 01 | Flagged UNC | Y | N | N |
| 10 | Pseudo UNC | Y | Y | Y |
| 00 | Real UNC | Y | Y | Y |
| 11 | Marked Real UNC | Y | N | Y |

In Table 1, "Host Report" denotes an operation of reporting that a particular sector region is an uncorrectable sector region to the host 5 when the memory controller 20 receives a read command from the host 5 to read the sector data stored in the sector region.

"Error Logging" denotes an operation that the memory controller 20 logs an uncorrectable sector region on the non-volatile memory 40, or a separate memory. "Block Map Out" denotes an operation that the memory controller 20 removes an uncorrectable sector region so as not to be reused. "Flagged UNC" denotes a sector region to which data error correction trial or error logging is not applied and which is the same as an uncorrectable sector region in form of a genuine (or intrinsic) defect. "Pseudo UNC" denotes a sector region to which data error correction trial or error logging is applied and which is the same as an uncorrectable sector region in form of a genuine defect. "Real UNC" denotes an uncorrectable sector region generated during an operation, for example, merge, wear-leveling, or refresh, of transferring data by itself in the non-volatile memory system 10 not according to a command of the host 5. In this case, by indicating the uncorrectable sector region as a Marked Real UNC in a target sector region where the data is to be stored, the target sector region may be prevented from being a Block Map Out later.

As described above, the uncorrectable information may be embodied by a plurality of bits to distinguish the type of an uncorrectable sector region. Although Table 1 shows four types of an uncorrectable sector region, the type of an uncorrectable sector region is not limited thereto.

Figure 4:
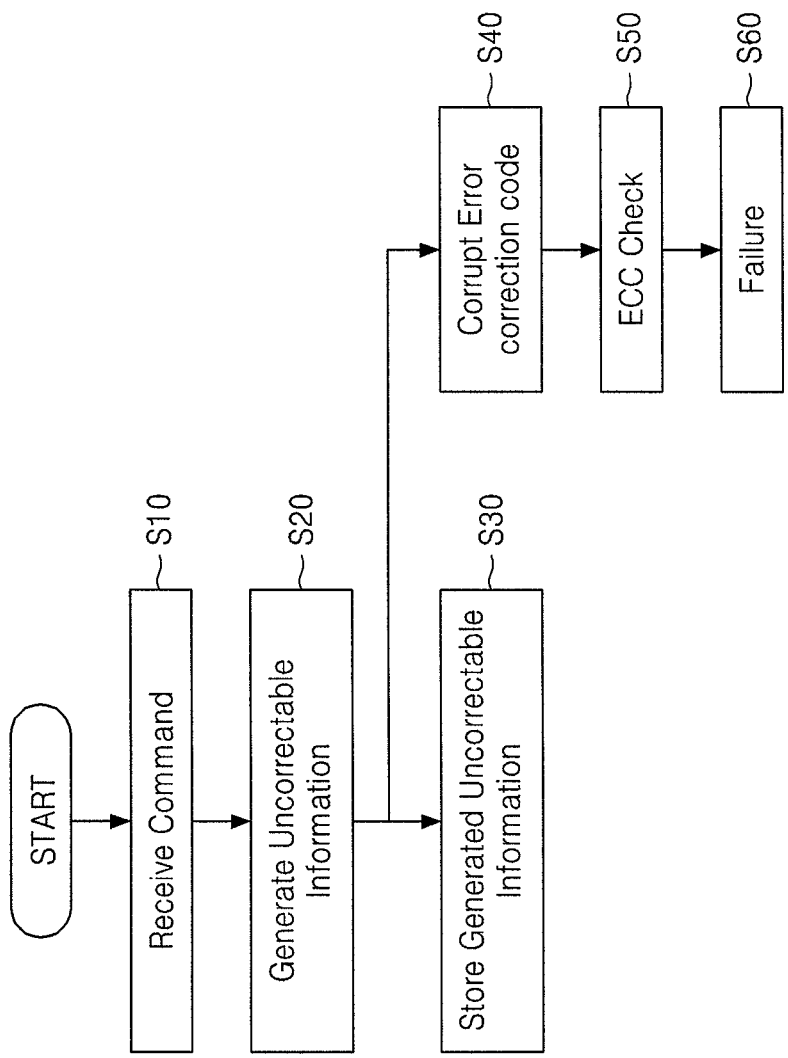
FIG. 4 illustrates a flowchart of an exemplary operation of the data processing system of FIG. 1.

FIG. 4 illustrates a flowchart of an exemplary operation of the data processing system of FIG. 1. The data processing system may be, e.g., a personal computer (PC), tablet PC, etc. Referring to FIGS. 1-4, the memory controller 20 may receive a command output from the host 5, for example, a command including logical addresses to assign a third sector region 61-3 of the first page 51-1 of the first block 50 of a memory array to be an uncorrectable sector region (S10).

The memory controller 20 may map the logical addresses to physical addresses of the third sector region 61-3 of the first page 51-1 of the first block 50. The memory controller 20 may generate uncorrectable information to assign the third sector region 61-3 to be an uncorrectable sector region based on the command output from the host 5 and the physical addresses. The memory controller 20 may transmit generated information to the non-volatile memory interface 34 (S20).

The non-volatile memory interface 34 may store the uncorrectable information in the uncorrectable information region 63-1 of the third sector region 61-3 assigned by the physical addresses under the control of the microprocessor 24 (S30). In some embodiments, when the memory controller 20 assigns the third sector region 61-3 as an uncorrectable sector region, the error correction code generation unit 32 may change an error correction code ECC3 to be stored in the management region of the third sector region 61-3 under the control of the microprocessor 24. That is, the error correction code generation unit 32 may corrupt the error correction code ECC3 to be stored in the management region (S40).

Accordingly, when error correction check is performed by the error correction code generation unit 32 during a read operation (S50), the error correction code generation unit 32 may generate a failure of write data SD3 stored in the write data region by using the error correction code ECC3 that is corrupted and stored in the management region of the third sector region 61-3 (S60).

As described above, the non-volatile memory system 10 may have an effect of storing uncorrectable sector information on all logical addresses by using the reserved region of each page. In embodiments of a non-volatile memory system employing one or more features described herein, since uncorrectable sector information may be stored together in a page where sector data is stored, the uncorrectable sector information may be efficiently managed.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A non-volatile memory system, comprising:
a non-volatile memory including a data region including a sector region for storing sector data, and an uncorrectable information region for storing uncorrectable sector information on the sector region; and
a controller including an information generation unit configured to generate the uncorrectable sector information that indicates whether the sector region is assigned to an uncorrectable sector region, the uncorrectable sector information further indicating a type of the uncorrectable sector region corresponding to the sector region.

2. The system as claimed in claim 1, wherein the data region and the uncorrectable information region exist on a same page.

3. The system as claimed in claim 1, wherein the sector region includes a write data region for storing write data and a management region for storing an error correction code to perform error correction with respect to the write data stored in the write data region, and
wherein the controller includes an error correction code generator to store the error correction code in the management region, the error correction code to generate an error during the error correction when the information generator assigns the sector region to be the uncorrectable sector region.

4. The system as claimed in claim 3, wherein the controller further includes a microprocessor, a read only memory (ROM), a random access memory (RAM), a host interface, and a non-volatile memory interface.

5. The system as claimed in claim 4, wherein the error correction code generator includes a processing module adapted to execute a program stored in at least one of the ROM or the RAM under control of the microprocessor.

6. The system as claimed in claim 4, wherein the non-volatile memory interface provides an interface for communications between the microprocessor and the non-volatile memory under control of the microprocessor.

7. The system as claimed in claim 6, wherein
the non-volatile memory includes a NAND flash memory and
the non-volatile memory interface includes a NAND flash memory interface.

8. The system as claimed in claim 1, wherein the non-volatile memory includes a plurality of flash memory cells.

9. The system as claimed in claim 8, wherein a memory cell array including the plurality of flash memory cells is divided into n blocks, and each of the n blocks is divided into m pages, and each of the m pages includes a region corresponding to the data region and a region corresponding to the uncorrectable information region, where n and m are each natural numbers.

10. The system as claimed in claim 9, wherein the respective data region of each of the m pages includes a plurality of sector regions, each of the sector regions including a write data region for storing write data and a management region for storing management information.

11. The system as claimed in claim 10, wherein the management information includes an error correction code for performing error correction with respect to the corresponding write data.

12. The system as claimed in claim 10, wherein the respective data region including the uncorrectable information region stores information with respect to each of the sector regions.

13. The system as claimed in claim 1, wherein the system is a memory card.

14. The system as claimed in claim 1, wherein the system is a solid state drive (SSD).

15. A system, comprising:
a non-volatile memory system; and
a host configured to access the non-volatile memory system,
wherein the non-volatile memory system includes:
a non-volatile memory including a data region comprising a sector region for storing sector data, and an uncorrectable information region for storing uncorrectable sector information on the sector region; and
a controller including an information generation unit configured to generate the uncorrectable sector information that indicates whether the sector region is assigned to an uncorrectable sector region, the uncorrectable sector information further indicating a type of the uncorrectable sector region corresponding to the sector region.

16. The system as claimed in claim 15, wherein the data region and the uncorrectable information region exist on a same page.

17. The system as claimed in claim 15, wherein the sector region includes a write data region for storing write data and a management region for storing an error correction code to perform error correction with respect to the write data stored in the write data region, and
wherein the controller includes an error correction code generator to store the error correction code in the management region, the error correction code to generate an error during the error correction when the information generation unit assigns the sector region to be the uncorrectable sector region.

18. The system as claimed in claim 15, wherein the system is a personal computer (PC) or tablet PC.

19. A method of operating a non-volatile memory system, the method comprising:
receiving, by a controller, a command output from a host;
generating, by the controller, uncorrectable sector information indicating whether a sector region of a page of a non-volatile memory is assigned to an uncorrectable sector region according to a received command; and
storing, by the controller, generated uncorrectable sector information in an uncorrectable information region of the page, wherein the uncorrectable sector information further indicates a type of the uncorrectable sector region corresponding to the sector region.

20. The method as claimed in claim 19, further comprising adding, by the controller, an error correction code to the write data by using an error correction code generator, the error correction code to generate a failure during error correction with respect to the write data when the sector region is assigned to the uncorrectable sector region.

21. The system as claimed in claim 1, wherein the controller generates the uncorrectable sector information based on a command from a host.

22. The system as claimed in claim 1, wherein:
when the uncorrectable sector information has a first value, the uncorrectable sector information indicates that the sector region is a first type in which data error correction trial or error logging is not applied, and
when the uncorrectable sector information has a second value, the uncorrectable sector information indicates that the sector region is a second type in which data error correction trial or error logging is applied.

23. The system as claimed in claim 1, wherein:
when the uncorrectable sector information has a first value, the uncorrectable sector information indicates that the sector region was generated during an operation of the non-volatile memory.

24. The system as claimed in claim 23, wherein the operation is at least one of a merge operation, wear-leveling operation, or refresh operation.

25. The system as claimed in claim 23, wherein the operation is a data transfer operation.

26. The system as claimed in claim 25, the data transfer operation is one performed independently of a host command.

27. The system as claimed in claim 1, wherein:
when the uncorrectable sector information has a first value, the uncorrectable sector information indicates that the sector region is to be reused, and
when the uncorrectable sector information has a second value, the uncorrectable sector information indicates that the sector region is not to be reused.

* * * * *